United States Patent
Lee et al.

(10) Patent No.: US 9,656,908 B2
(45) Date of Patent: May 23, 2017

(54) INORGANIC ADHESIVE COMPOSITION AND HERMETIC SEALING METHOD USING SAME

(71) Applicant: Corning Precision Materials Co., Ltd., Chungcheongnam-do (KR)

(72) Inventors: Kiyeon Lee, Chungcheongnam-do (KR); Jhee-Mann Kim, Chungcheongnam-do (KR); Jaemin Cha, Chungcheongnam-do (KR); Jaeho Lee, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 0 days.

(21) Appl. No.: 14/407,254

(22) PCT Filed: Jun. 12, 2013

(86) PCT No.: PCT/KR2013/005156
§ 371 (c)(1),
(2) Date: Dec. 11, 2014

(87) PCT Pub. No.: WO2013/187682
PCT Pub. Date: Dec. 19, 2013

(65) Prior Publication Data
US 2015/0166404 A1 Jun. 18, 2015

(30) Foreign Application Priority Data
Jun. 12, 2012 (KR) .................. 10-2012-0062736

(51) Int. Cl.
| | | |
|---|---|---|
| C09J 1/02 | (2006.01) | |
| C03C 8/24 | (2006.01) | |
| C09J 11/04 | (2006.01) | |
| H01L 51/52 | (2006.01) | |

(52) U.S. Cl.
CPC ....... *C03C 8/24* (2013.01); *C09J 1/02* (2013.01); *C09J 11/04* (2013.01); *C03C 2204/00* (2013.01); *C03C 2207/02* (2013.01); *H01L 51/5246* (2013.01)

(58) Field of Classification Search
CPC ..... C09J 1/02; C09J 11/04; C03C 8/24; C03C 2204/00; C03C 2207/02; H01L 51/5246
See application file for complete search history.

(56) References Cited

U.S. PATENT DOCUMENTS

| | | | | |
|---|---|---|---|---|
| 4,066,463 A | * | 1/1978 | Chollet | ............... C09J 1/02 106/162.81 |
| 4,260,420 A | * | 4/1981 | Charnley | ............... C09J 1/02 106/628 |
| 4,341,559 A | * | 7/1982 | Friedemann | ........... B22C 1/167 106/162.2 |
| 4,361,659 A | * | 11/1982 | Friedemann | ............. C09J 1/02 106/634 |
| 4,403,059 A | * | 9/1983 | Laut | ............... C04B 28/26 156/325 |
| 4,600,437 A | * | 7/1986 | Sugiura | ............ C04B 14/106 106/38.3 |
| 7,425,518 B2 | | 9/2008 | Yoshida et al. | |
| 8,470,723 B2 | | 6/2013 | Naito et al. | |
| 2004/0164662 A1 | | 8/2004 | Cho et al. | |
| 2008/0111479 A1 | | 5/2008 | Choi et al. | |
| 2009/0021169 A1 | * | 1/2009 | Kweon | ............... H01J 11/12 313/584 |

FOREIGN PATENT DOCUMENTS

| | | |
|---|---|---|
| DE | 4330770 A1 * | 3/1995 |
| JP | 2011225426 A | 11/2011 |
| KR | 20040075166 A | 8/2004 |
| KR | 20060029233 A | 4/2006 |
| KR | 20060084403 A | 7/2006 |
| KR | 100824531 B1 | 4/2008 |
| KR | 20100049651 A | 5/2010 |
| KR | 20100084476 A | 7/2010 |
| KR | 20110106495 A | 9/2011 |
| KR | 20110111503 A | 10/2011 |

OTHER PUBLICATIONS

International Search Report for Application No. PCT/KR2013/005156 dated Aug. 19, 2013.

* cited by examiner

*Primary Examiner* — Anthony J Green
(74) *Attorney, Agent, or Firm* — Lerner, David, Littenberg, Krumholz & Mentlik, LLP

(57) ABSTRACT

The present invention relates to an inorganic adhesive composition and to a hermetic sealing method, and more specifically relates to an inorganic adhesive composition with which an organic solvent is not used and to a hermetic sealing method using same. To this end, the present invention provides an inorganic adhesive composition comprising: between 20 and 80 parts by weight of a water glass diluted solution containing between 60 and 90 parts by weight of water glass ($Na_2SiO_2$); between 20 and 80 parts by weight of a refractory inorganic filler; and a black pigment.

6 Claims, 2 Drawing Sheets

INORGANIC ADHESIVE COMPOSITION AND HERMETIC SEALING METHOD USING SAME

CROSS-REFERENCE TO RELATED APPLICATION

The present application is a national phase entry under 35 U.S.C. §371 of International Application No. PCT/KR2013/005156 filed Jun. 12, 2013, published in Korean, which claims priority from Korean Patent Application No. 10-2012-0062736 filed Jun. 12, 2012; all of which are incorporated herein by reference.

TECHNICAL FIELD

The present invention relates to inorganic adhesive composition and method for hermetic sealing, particularly to inorganic adhesive composition not accompanied by organic solvent and method for hermetic sealing using the same.

BACKGROUND ART

Hermetic sealing is required to minimize influence of humidity and gas from outside, so as to improve performance and durability of electrical elements, such as, Organic Light Emitting Diode (OLED), Dye-sensitized solar cell (DSSC) or lighting (LED).

Especially, OLED becomes accepted as next generation display technology by its merits, such as, high response time, self-light-emitting with backlight unneeded, proper for manufacturing ultra-thin panel, low power consumption, and wide viewing angle.

Because OLED is susceptible to humidity and air, sealing is processed between upper and lower substrates to protect OLED device by blocking out humidity and air. In the process, glass frit paste is used as sealing agent.

Conventionally, as sealing material for OLED, frit glass such as V2O5-P2O5 has been used.

Especially, Korean patent publication 10-2010-0084476 by Hitachi discloses glass composition having low melting point which is produced by first step to prepare glass powder by melting V2O5, MnO, Fe2O3 in glass formulation and second step to mix low expansion ceramic powder with the glass powder.

And, Korean patent publication 10-2010-0049651 by Yamato discloses glass composition for adhesion which is produced by mixing low expansion ceramic powder with V2O5-BaO—ZnO glass.

The above production of glass composition includes steps to melt, cool down and pulverize glass, and to add certain amount of pulverized low expansion ceramic into glass powder to control thermal expansion coefficient.

However, thermal expansion coefficient of glass composition produced by the above method is significantly short of thermal expansion coefficient of frontal or posterior glass of OLED. In particular, difficulty of adhesion between frontal glass and metal is a problem.

In addition, to apply frit powder prepared as above on glass, processes to make the frit powder into paste using organic binder and then to burn out the binder at temperature of 400° C. are required. But, toxic substance is emitted during the processes.

RELATED ARTS

Patent Documents (Patent document 1) Korean patent publication 10-2010-0084476

(Patent document 2) Korean patent publication 10-2010-0049651

Technical Problem

The present invention is conceived to solve the problems as above, which provide inorganic adhesive composition having improved adhesive strength but preventing toxic substance from being emitted and provide method for hermetic sealing using the same.

Technical Solution

The present invention provides inorganic adhesive composition, comprising: 20-80 weight parts of diluted solution of water glass, the diluted solution of water glass having 60-90 weight percents of water glass (Na2SiO2); 20-80 weight parts of fire resistant inorganic filler; and black pigment.

Thermal expansion coefficient of the inorganic adhesive composition is desirable to have 32*10–7/° C.~40*10–7/° C.

The black pigment could be 1-5 weight parts.

The black pigment may include one selected from CuO+Cr2O3, CuO+Fe2O3+CoO and CuO+Cr2O3+Fe2O3+CoO.

The fire resistant inorganic filler may include at least one selected from Alumina (Al2O3), Zircon, Cordierite, Silica (SiO2), Eucryptite and Spodumen.

It's desirable that the fire resistant inorganic filler has average particle diameter of 0.1~30 μm.

The diluted solution of water glass may include water glass and water.

The inorganic adhesive composition could be inorganic adhesive composition for OLED.

In addition, embodiments provide a method for hermetic sealing which bonds and seals a first substrate and a second substrate using inorganic adhesive composition, comprising: a step to apply inorganic adhesive composition to around an outer edge of at least one of the first and the second substrates; a step to bond the first and the second substrates; and a step to heat the inorganic adhesive composition by laser irradiation, wherein the inorganic adhesive composition comprises 20-80 weight parts of diluted solution of water glass, the diluted solution of water glass having 60-90 weight percents of water glass (Na2SiO2); 20-80 weight parts of fire resistant inorganic filler; and black pigment.

And, the method for hermetic sealing further comprises a step, between the step to bond and the step to heat, to fire the inorganic adhesive composition at 200° C. or less.

Advantageous Effects

Toxic substance is not emitted during applying and drying inorganic adhesive composition, and adhesive strength is improved by increasing heating efficiency using laser.

And, working efficiency is also improved because of easy control over viscosity of inorganic adhesive composition.

MODE FOR INVENTION

Figure 1:
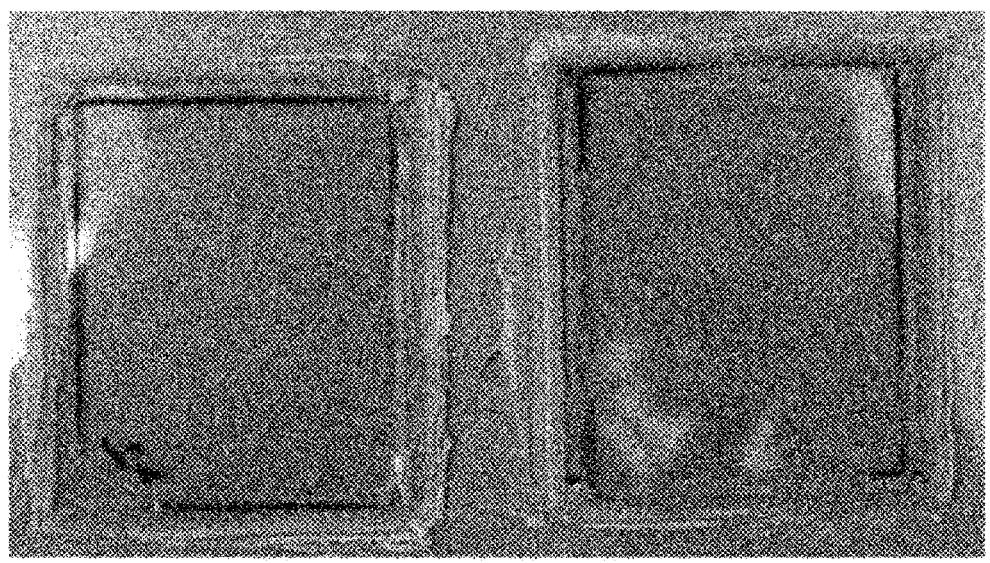
FIG. 1 is a picture that two borosilicate glasses are bonded by inorganic adhesive composition according to an embodiment of this invention.

In the following detailed description, inorganic adhesive composition and method for hermetic sealing using the same according to embodiments of this invention are set forth referring to accompanied drawings.

And, related well-known function or components have not been described in detail so as not to unnecessarily obscure aspects of the embodiments.

Inorganic adhesive composition according to an embodiment of this invention may comprise 20-80 weight parts of diluted solution of water glass, the diluted solution of water glass having 60-90 weight percents of water glass ($Na_2SiO_2$), 20-80 weight parts of fire resistant inorganic filler; and black pigment.

Above such inorganic adhesive composition could be used for a display device, preferably, for bonding between frontal and posterior glass or between frontal glass and metal aluminum sheet of a OLED display device.

Diluted solution of water glass has adhesive property, includes 60-90 weight percents of water glass, and forms 20-80 weight parts.

The water glass commonly could be what is well known in a corresponding field. And, diluted solution of water glass is produced by mixing water or other solvent with water glass.

By producing inorganic adhesive composition using water glass which is easily mixed with solvent or water, it would be easy to mix inorganic filler and control viscosity of inorganic adhesive.

Fire resistant inorganic filler forms 20-80 weight parts, and controls thermal expansion coefficient of inorganic adhesive composition. That is, it makes inorganic adhesive composition have same or close thermal expansion coefficient as adherent's, and improve adhesive strength and durability of adherent.

It's difficult to apply to adherent due to difficulty in controlling viscosity of inorganic adhesive composition when fire resistant inorganic filler forms less than 20 weight parts or exceeds 80 weight parts.

It's preferable that fire resistant inorganic filler has average particle diameter of 0.1~30 μm. When average particle diameter of fire resistant inorganic filler is less than 0.1 μm, it's difficult for particle of filler to disperse, and difficult to achieve hermetic adhesion because adhesion surface is prone to crack after being bonded with glass. And, when average particle diameter of filler exceeds 30 μm, it's difficult to apply inorganic adhesive composition due to tixotropic phenomenon.

The fire resistant inorganic filler may include at least one selected from Alumina ($Al_2O_3$), Zircon, Cordierite, Silica ($SiO_2$), Eucryptite and Spodumen.

Black pigment enables inorganic adhesive composition to better absorb heat energy from laser during laser heating on applied inorganic adhesive composition, which improves adhesive strength of inorganic adhesive composition.

The black pigment may include one selected from $CuO+Cr_2O_3$, $CuO+Fe_2O_3+CoO$ and $CuO+Cr_2O_3+Fe_2O_3+CoO$.

Particularly with a display device like OLED, hermetic sealing by inorganic adhesive composition is carried out to protect interior thereof from external environment such as oxygen or humidity. In this case, adhesive strength of inorganic adhesive composition is made improved by locally heating inorganic adhesive composition using laser.

Embodiments of this invention improve adhesive strength of inorganic adhesive composition by enhancing absorbing capacity thereof for laser through adding black pigment therein.

Black pigment could form 1-5 weight parts.

Therefore, inorganic adhesive composition according to embodiments of this invention which comprises diluted solution of water glass, fire resistant inorganic filler, and black pigment prevents toxic substance from being emitted during applying or drying inorganic adhesive composition, and improves adhesive strength in connection with laser irradiation. That is, because inorganic adhesive composition in this disclosure doesn't use conventional resin binder, binder burn-out is not needed so no toxic substance is generated, and adhesive strength is improved thanks to efficient absorption of laser by black pigment.

Further, water glass and fire resistant inorganic filler could be easily mixed because water glass and fire resistant inorganic filler are highly soluble in water. And, it's easy to control viscosity of inorganic adhesive composition by adjusting amount of water. In addition, no toxic substance is generated during applying or drying adhesive due to using water as solvent.

Thermal expansion coefficient of inorganic adhesive composition according to an embodiment of this invention could be $32*10-7/°$ C.~$40*10-7/°$ C.

By the fact that inorganic adhesive composition has approximate thermal expansion coefficient to that of glass, it's possible to prevent crack caused by difference of thermal expansion coefficient between inorganic adhesive composition and glass when bonding glass and glass or glass and aluminum metal.

Embodiments of this invention are illustrated below.

Embodiment 1

Inorganic adhesive composition is produced from following components by mixing with a stirrer: fire resistant inorganic filler as a mixture of Alumina 20 gr, Cordierite 10 gr and Eucryptite 10 gr, and 3 weight parts of black pigment are added to 60 gr of mixed solution including 70 weight parts of water glass and 30 weight parts of distilled water.

Embodiment 2

Inorganic adhesive composition is produced from following components by mixing with a stirrer: fire resistant inorganic filler as a mixture of Zircon 30 gr, Silica 20 gr and Eucryptite 20 gr, and 2 weight parts of black pigment are added to 30 gr of mixed solution including 83 weight parts of water glass and 17 weight parts of distilled water.

Embodiment 3

Inorganic adhesive composition is produced from following components by mixing with a stirrer: fire resistant inorganic filler as a mixture of Alumina 10 gr, Zircon 10 gr and Cordierite 50 gr, and 3 weight parts of black pigment are added to 30 gr of mixed solution including 83 weight parts of water glass and 17 weight parts of distilled water.

Embodiment 4

Inorganic adhesive composition is produced from following components by mixing with a stirrer: fire resistant inorganic filler as a mixture of Zircon 20 gr and Eucryptite 40 gr, and 3 weight parts of black pigment are added to 40 gr of mixed solution including 83 weight parts of water glass and 17 weight parts of distilled water.

Embodiment 5

Inorganic adhesive composition is produced from following components by mixing with a stirrer: inorganic filler of Eucryptite 50 gr and 3 weight parts of black pigment are added to 50 gr of mixed solution including 83 weight parts of water glass and 17 weight parts of distilled water.

Embodiment 6

Inorganic adhesive composition is produced from following components by mixing with a stirrer: fire resistant inorganic filler as a mixture of Silica 10 gr, Cordierite 20 gr and Eucryptite 30 gr, and 2 weight parts of black pigment are added to 40 gr of mixed solution including 83 weight parts of water glass and 17 weight parts of distilled water.

Using inorganic adhesive composition described in the above embodiments from 1 to 6, sodalime water and borosilicate glass, borosilicate glass and borosilicate glass, and borosilicate glass and metal aluminum sheet are bonded respectively, and then fired (dried) at the temperature of 100° C. Hermetic sealing is carried out by laser irradiation and results of PTC test on whether leakage occurs or not are shown in Table 1.

TABLE 1

| Embodiments | | 1 | 2 | 3 | 4 | 5 | 6 |
|---|---|---|---|---|---|---|---|
| Mixing ratio (weight part) | Water glass | 70 | 83 | 83 | 83 | 83 | 83 |
| | Distilled water | 30 | 17 | 17 | 17 | 17 | 17 |
| Amount used (gr) | | 60 | 30 | 30 | 40 | 50 | 40 |
| Fire resistant inorganic filler (gr) | Alumina | 20 | | 10 | | | |
| | Zircon | | 30 | 10 | 20 | | |
| | Silica | | 20 | | | | 10 |
| | Cordierite | 10 | | 50 | | | 20 |
| | Eucryptite | 10 | 20 | | 40 | 50 | 30 |
| Black pigment (weight part) | | 3 | 2 | 3 | 3 | 3 | 2 |
| Firing temperature (° C.) | | 100 | 100 | 100 | 100 | 100 | 100 |
| Thermal expansion coefficient | | 40 | 45 | 34 | 30 | 25 | 32 |
| PTC leakage test (hr) | | 120 | 100 | 144 or more | 144 or more | 144 or more | 144 or more |

As shown in [Table 1], inorganic adhesive composition according to the embodiments has approximate thermal expansion coefficient to that of glass and has an excellent hermetic effect.

FIG. 1 is a picture that two borosilicate glasses are bonded by inorganic adhesive composition according to an embodiment of this invention. And, FIG. 2 is a picture that a borosilicate glass and a metal aluminum sheet are bonded by inorganic adhesive composition according to an embodiment of this invention.

Figure 2:
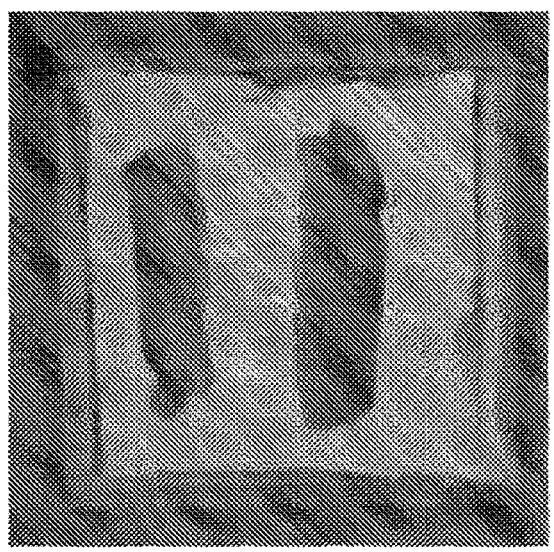
FIG. 2 is a picture that a borosilicate glass and a metal aluminum sheet are bonded by inorganic adhesive composition according to an embodiment of this invention.

As illustrated in FIGS. 1 and 2, it's possible to hermetically bond glass and glass or glass and metal aluminum sheet, when using the inorganic adhesive composition according to embodiments of this invention.

Figure 3:
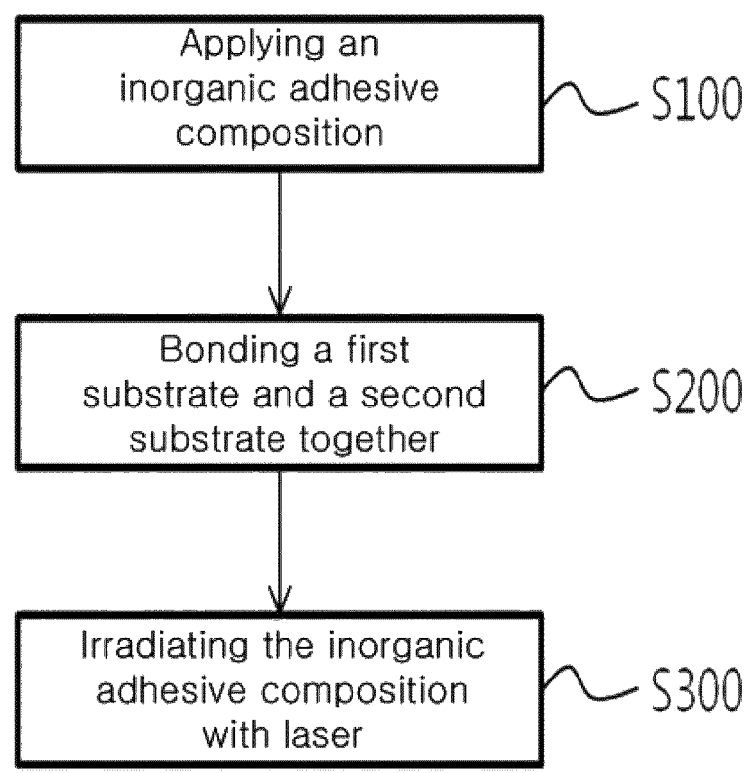
FIG. 3 is a schematic flow of method for hermetic sealing according to an embodiment of this invention.

FIG. 3 is a schematic flow of method for hermetic sealing according to an embodiment of this invention.

Referring to FIG. 3, method for hermetic sealing according to an embodiment of this invention comprises, a step to apply (S100), a step to bond (S200), and a step to heat (S300).

To hermetically seal a first substrate and a second substrate, firstly, above described inorganic adhesive composition is applied to around an outer edge of at least one of the first and the second substrates (S100).

When applying the inorganic adhesive composition, a dispenser could be used.

The first and the second substrates are bonded after being applied with the inorganic adhesive composition (S200), and then the first and the second substrates are hermetically sealed with heating the inorganic adhesive composition by laser irradiation (S300).

In this case, by firing (drying) the inorganic adhesive composition at 200° C. or less after the step to bond (S200) and before the step to heat (S300), it's possible to prevent weather-proof characteristic from being decreased by humidity.

The foregoing description, for purpose of explanation, has been described with reference to specific embodiments and drawings. However, the illustrative discussions above are not intended to be exhaustive or to limit the invention to the precise forms disclosed. Many modifications and variations are possible by others skilled in the art in view of the above teachings.

Therefore, scope of this invention should not be determined only by the foregoing description, but be determined by the following claims and equivalents thereto.

The invention claimed is:

1. A hermetically sealed composition comprising:
   a first substrate having an outer edge;
   a second substrate having an outer edge;
   an inorganic adhesive composition comprising:
   20-80 weight parts of diluted solution of water glass, the diluted solution of water glass having 60-90 weight percents of water glass ($Na_2SiO_2$);
   20-80 weight parts of fire resistant inorganic filler; and
   1-5 weight parts of black pigment for enhancing absorption of a laser,
   wherein the black pigment comprises one selected from the group consisting of $CuO+Cr_2O_3$, $CuO+Fe_2O_3+CoO$ and $CuO+Cr_2O_3+Fe_2O_3+CoO$;
   wherein the inorganic adhesive composition is applied for application between the outer edges of the first and second substrates and is configured to respond to laser power applied to the inorganic adhesive composition between the first and second substrates to form a seal between the first and second substrates.

2. The hermetically sealed composition of claim 1, wherein a thermal expansion coefficient of the inorganic adhesive composition is $32*10^{-7}/°$ C.$-40*10^{-7}/°$ C.

3. The hermetically sealed composition of claim 1, wherein the fire resistant inorganic filler comprises at least one selected from the group consisting of: Alumina($Al_2O_3$), Zircon, Cordierite, Silica($SiO_2$), Eucryptite and Spodumen.

4. The hermetically sealed composition of claim 1, wherein the fire resistant inorganic filler has an average particle diameter of 0.1-30 μm.

5. The hermetically sealed composition of claim 1, wherein the diluted solution of water glass comprises the water glass and water.

6. The hermetically sealed composition of claim 1, wherein the first substrate and the second substrate are organic light-emitting diodes.

* * * * *